United States Patent
Kim et al.

(10) Patent No.: US 9,362,207 B2
(45) Date of Patent: Jun. 7, 2016

(54) METAL WIRING OF SEMICONDUCTOR DEVICE AND METHOD FOR MANUFACTURING THE SAME

(71) Applicant: MAGNACHIP SEMICONDUCTOR, LTD., Cheongju-si (KR)

(72) Inventors: Kwan-soo Kim, Cheongju-si (KR);
Tae-jong Lee, Cheongju-si (KR);
Kang-sup Shin, Cheongju-si (KR);
Si-bum Kim, Cheongju-si (KR);
Yang-beom Kang, Cheongju-si (KR);
Jong-yeul Jeong, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 262 days.

(21) Appl. No.: 13/714,866

(22) Filed: Dec. 14, 2012

(65) Prior Publication Data
US 2014/0035146 A1    Feb. 6, 2014

(30) Foreign Application Priority Data
Aug. 1, 2012  (KR) .................... 10-2012-0084520

(51) Int. Cl.
| | | |
|---|---|---|
| *H01L 23/485* | (2006.01) | |
| *H01L 21/768* | (2006.01) | |
| *H01L 23/522* | (2006.01) | |
| *H01L 23/528* | (2006.01) | |
| *H01L 23/532* | (2006.01) | |

(52) U.S. Cl.
CPC ........ *H01L 23/485* (2013.01); *H01L 21/76801* (2013.01); *H01L 21/76877* (2013.01); *H01L 23/5227* (2013.01); *H01L 23/5283* (2013.01); *H01L 23/5286* (2013.01); *H01L 23/53295* (2013.01); *H01L 2924/0002* (2013.01)

(58) Field of Classification Search
CPC .................................................. H01L 23/5227
See application file for complete search history.

(56) References Cited

U.S. PATENT DOCUMENTS

| | | | |
|---|---|---|---|
| 4,111,775 A | 9/1978 | Hollis, Jr. et al. | |
| 2005/0230837 A1* | 10/2005 | Taghizadeh-Kaschani | .. 257/760 |
| 2005/0280120 A1* | 12/2005 | Tomita | .......... 257/620 |
| 2011/0175193 A1* | 7/2011 | Nakagawa | .......... 257/531 |

* cited by examiner

*Primary Examiner* — Raj R Gupta
(74) *Attorney, Agent, or Firm* — NSIP Law

(57) ABSTRACT

A metal wiring for applying a voltage to a semiconductor component of a semiconductor device, the semiconductor device comprising a low voltage applying region adjacent to a high voltage applying region, is provide. The metal wiring includes: an isolator region, a first lower metal layer electrically connected to the semiconductor component, a first upper metal layer configured to be electrically connected to an external power supply, and a plurality of inter-metal dielectric layers deposited between the first lower metal layer and the first upper metal layer, each of the plurality of inter-metal dielectric layers comprising at least one contact plug for providing an electrical connection between the first lower metal layer and the first upper metal layer.

27 Claims, 9 Drawing Sheets a''  b''

METAL WIRING OF SEMICONDUCTOR DEVICE AND METHOD FOR MANUFACTURING THE SAME

CROSS-REFERENCE TO RELATED APPLICATIONS

This application claims the benefit under 35 U.S.C. §119(a) of Korean Patent Application No. 10-2012-0084520, filed on Aug. 1, 2012, in the Korean Intellectual Property Office, the entire disclosure of which is incorporated herein by reference for all purposes.

BACKGROUND

1. Field

The following description relates to methods and apparatuses relating to metal wiring, and such as, for example, a metal wiring of semiconductor device and a method for manufacturing the same.

2. Description of Related Art

When a metal wiring is formed in a semiconductor device, a digital isolation region is formed with a thick oxide film between a lower metal layer and an upper metal layer for insulation in a region of the semiconductor device where a high voltage of 5,000V or above is applied. The digital isolator region using such an oxide film is usually formed in combination with an adjacent low voltage region.

A general metal wiring of a low voltage region of a semiconductor device is obtained by filling a metal in a VIA hole of an inter-metal dielectric layer having an adequate thickness. The thickness of an inter-metal dielectric layer used in a low voltage region is much greater than the thickness of the digital isolator formed in a high voltage region mentioned above. In addition, in the inter-metal dielectric layer, a metal is filled into a VIA hole in order to form a contact plug. A contact plug is placed between two metal layers, and thus a metal wiring of the semiconductor device comprises a plurality of metal layers and contact plugs that are formed between the plurality of metal layers.

To this end, the process of forming a metal wiring in a conventional semiconductor device requires a process for forming each metal layers and a VIA hole forming process to form each contact plugs.

However, in a case of simultaneously producing a digital isolator and a low voltage region with a metal wiring of a conventional semiconductor, since there is a big difference of thickness between the inter-metal dielectric layer used in a low voltage region and the thickness of the oxide film used in the aforementioned digital isolator, the number of processes required for forming a plurality of metal layers and a plurality of contact plugs increases, thereby increasing the processing costs and decreasing the processing efficiency.

SUMMARY

In one general aspect, there is provided a metal wiring for applying a voltage to a semiconductor component of a semiconductor device, the semiconductor device comprising a low voltage applying region adjacent to a high voltage applying region. The metal wiring includes: an isolator region; a first lower metal layer electrically connected to the semiconductor component; a first upper metal layer configured to be electrically connected to an external power supply; and a plurality of inter-metal dielectric layers deposited between the first lower metal layer and the first upper metal layer, each of the plurality of inter-metal dielectric layers comprising at least one contact plug for providing an electrical connection between the first lower metal layer and the first upper metal layer. A contact plug of an inter-metal dielectric layer of one side in two adjacent inter-metal dielectric layers contacts a contact plug of an inter-metal dielectric layer of another side.

In the general aspect of the metal wiring, a contact plug of a lower most inter-metal dielectric layer may contact the first lower metal layer, and a contact plug of an upper most inter-metal dielectric layer may contact the first upper metal layer.

In the general aspect of the metal wiring, a contact plug of an inter-metal dielectric layer of one side in two adjacent inter-metal dielectric layers may contact a contact plug of an inter-metal dielectric layer of another side in a crisscross manner.

In the general aspect of the metal wiring, a contact plug of an inter-metal dielectric layer of a side in two adjacent inter-metal dielectric layers may contact a contact plug of an inter-metal dielectric layer of another side to cross each other at right angles.

The general aspect of the metal wiring may further involve an etching stop layer formed between two adjacent interlayer insulation layers, and the contact plug may penetrate the etching stop layer.

In the general aspect of the metal wiring, the inter-metal dielectric layer may be an oxide film.

In the general aspect of the metal wiring, one or more tensile stress layer and one or more compressive stress layer may be deposited in at least one of the inter-metal dielectric layers.

In the general aspect of the metal wiring, a compressive stress layer may be arranged on an upper most portion of the at least one inter-metal dielectric layer.

In the general aspect of the metal wiring, in two adjacent inter-metal dielectric layers, a contact plug of an interlayer insulation layer of one side may have a same width as a contact plug of an interlayer insulation layer of another side.

In the general aspect of the metal wiring, the contact plug may be made of tungsten or copper.

In the general aspect of the metal wiring, the contact plugs may be configured to function as a metal wiring and as a contact plug, each of the contact plugs that function as the metal wiring consisting of a same material.

In the general aspect of the metal wiring, the isolator region may be in a high-voltage applying region.

The general aspect of the metal wiring may further include a second upper metal layer and a second lower metal layer formed on an upper portion and a lower portion of the isolator region.

In the general aspect of the metal wiring, the second upper metal layer and the second lower metal layer may be formed with the same material and thickness as the first upper metal layer and first lower metal layer, respectively.

In the general aspect of the metal wiring, the plurality of inter-metal dielectric layers and one or more etching stop layers may be formed between the second upper metal layer and the second lower metal layer.

In the general aspect of the metal wiring, in the isolator region, a total combined thickness of the plurality of inter-metal dielectric layers and the one or more etching stop layers may be 15-40 µm.

In the general aspect of the metal wiring, a thickness of each inter-metal dielectric layer may be 1-5 µm.

In the general aspect of the metal wiring, the inter-metal dielectric layers of the isolator region may be formed in a same process as the inter-metal dielectric layers of claim 1.

In another general aspect, there is provided a metal wiring of a semiconductor device, including: an isolator device, and a dummy pattern surrounding the isolator device, the dummy pattern comprising a first lower metal layer and a first upper metal layer, a plurality of inter-metal dielectric layers deposited between the first lower metal layer and the first upper metal layer, and a contact plug formed in the plurality of inter-metal dielectric layers, in which a contact plug of an inter-metal dielectric layer of one side in two adjacent inter-metal dielectric layers contacts a contact plug of an inter-metal dielectric layer of another side.

In the general aspect of the metal wiring, the isolator device may comprise an isolator region.

In the general aspect of the metal wiring, a second upper metal layer and a second lower metal layer may be formed on an upper portion and a lower portion, respectively, of the isolator region.

In the general aspect of the metal wiring, the second upper metal layer and the second lower metal layer may be formed with the same material and thickness as the first upper metal layer and first lower metal layer, respectively.

In the general aspect of the metal wiring, an inter-metal dielectric layer and an etching stop layer may be formed between the second upper metal layer and the second lower metal layer.

In the general aspect of the metal wiring, a total combined thickness of the inter-metal dielectric layers and etching stop layers in the isolator region may be 15-40 μm.

In the general aspect of the metal wiring, a thickness of each inter-metal dielectric layer may be 1-5 μm.

In another general aspect, there is provided a method of forming a metal wiring in a semiconductor device, the method involving: forming an insulation layer and a first lower metal layer above a semiconductor component; forming a plurality of inter-metal dielectric layers comprising at least one contact plug above a first lower metal layer; and forming a first upper metal layer on the plurality of inter-metal dielectric layers, in which the plurality of inter-metal dielectric layers extends from a low voltage applying region of the semiconductor device to a high voltage applying region, and forms an isolator region in the high voltage applying region; and the first lower metal layer is electrically connected to the semiconductor component in the low voltage applying region.

In the general aspect of the method, the first lower metal layer may be electrically connected to the first upper metal layer via the at least one contact plug, a first upper metal layer configured to be electrically connected to an external power supply, and the inter-metal dielectric layer comprising an oxide film; and the first lower metal layer may be electrically connected to the first upper metal layer via the at least one contact plug, the contact plug comprising tungsten or copper.

The general aspect of the method may further comprise forming a second lower metal layer and a second upper metal layer, the second lower metal layer and the second upper metal layer having the same thickness and material as the first lower metal layer and the first upper metal layer.

In the general aspect of the method, at least one etching stop layer may be formed among the plurality of inter-metal dielectric layers, the contact plug penetrating the least one etching stop layer; and one or more tensile stress layer and one or more compressive stress layer may be deposited during the forming of at least one of the plurality of inter-metal dielectric layers.

In the general aspect of the method, a total combined thickness of the plurality of inter-metal dielectric layers and the one or more etching stop layers may be 15-40 μm, and a thickness of each inter-metal dielectric layer may be 1-5 μm.

Other features and aspects may be apparent from the following detailed description, the drawings, and the claims.

Figure 1:
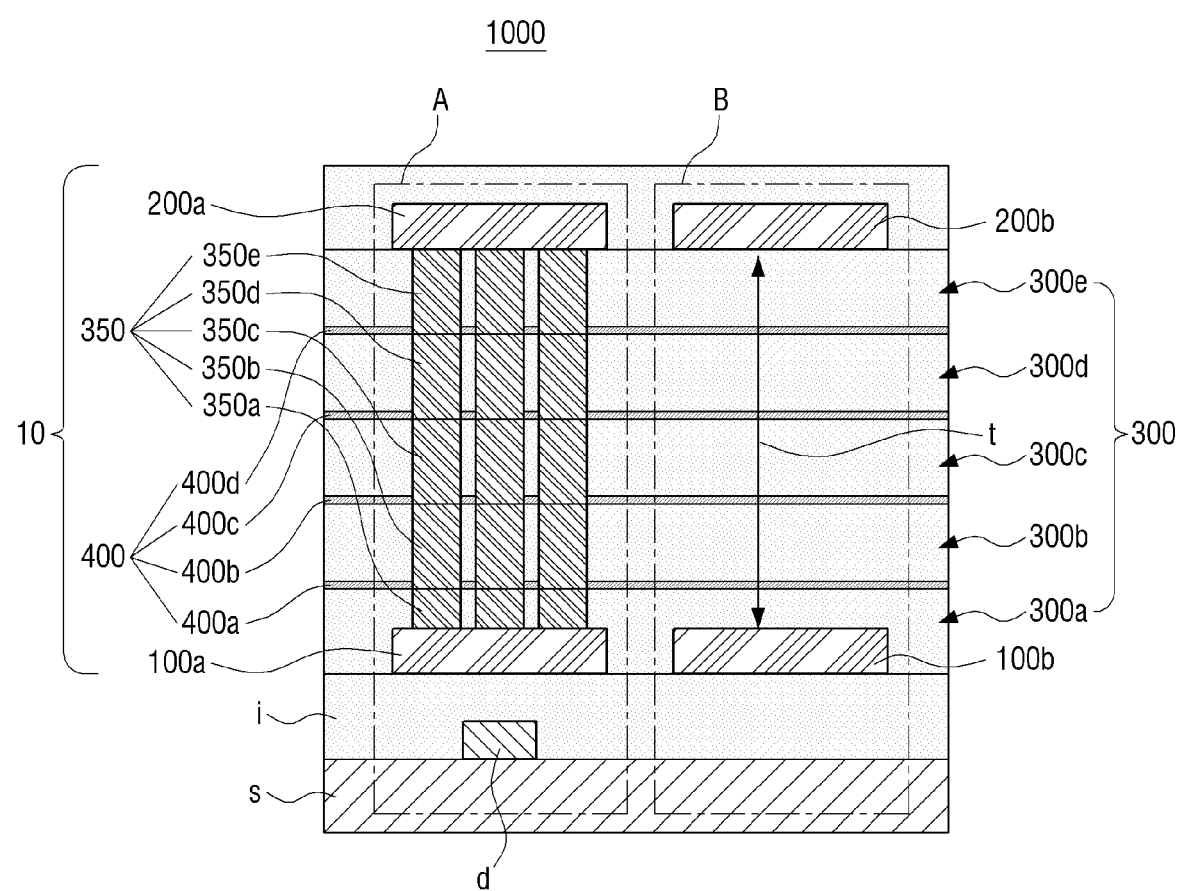
FIG. 1 is a cross-sectional view illustrating an example of a metal wiring of a semiconductor device.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

FIG. 1 is a cross-sectional view of a metal wiring of a semiconductor device according to one example.

Referring to FIG. 1, a semiconductor device 1000 includes a lower metal layer 100a, an upper metal layer 200a, an inter-metal dielectric layer 300, and an etching stop layer 400.

The semiconductor component d is a solid device using electrical conduction characteristics of a semiconductor. The semiconductor component d may be, for example, classified as a diode, a transistor, an integrated circuit, a resistance, a coil, a condenser, a switch, and the like. In the example illustrated in FIG. 1, the semiconductor component d is formed on a substrate s, and is coated with an insulation layer i consisting of an oxide film for insulation.

The metal wiring 10 may be used for applying a voltage to the semiconductor component d formed on the substrate s. Portions A and B of the semiconductor device 1000 illustrated in FIG. 1 are a low voltage applying region and a high voltage applying region, respectively. A semiconductor device may have a region where a high voltage is applied for design purposes or other reasons. The high voltage applying region B consists of a digital isolator device. Since the digital isolator device has a low metal pattern density, the digital isolator device may further have a dummy region to cover surroundings of the digital isolator device.

The digital isolator device may be formed with four separate inter-metal dielectric layers in a sub-micron device with a total thickness of the inter-metal dielectric layers ranging between about 16~17 μm. The digital isolator device provides voltage isolation between an upper metal layer 200b and a lower metal layer 100b. The upper metal layer 200b may carry a signal of 20 KV in the high voltage applying region B. Another upper metal layer 200a is electrically connected to another lower metal layer 100a through a fourth inter-metal dielectric layer 300e, a third inter-metal metal dielectric layer 300d, a second inter-metal dielectric layer 300c, and a first inter-metal dielectric metal layer 300b only at specific locations via VIA holes formed in the inter-metal dielectric layers 300e, 300d, 300c, 300b. For instance, a VIA hole formed in the fourth inter-metal dielectric layer may connect to VIA holes formed in the third, second and first inter-metal dielectric layers, each VIA holes filled with a conductive material. For instance, the diameter of a VIA hole that is filled with a conductive material can be about 30 µm to 50 µm. Further increasing the diameter of the VIA holes may impose stress on the wafer, and the stress may warp the wafer. To reduce the possibility of warping, SiOx layers and SiNx layers in may be deposited in turns because a SiOx layer and a SiNx layer impose stress in two opposite directions.

When a dummy region is formed, a planarization of an interlayer layer is improved. The dummy region may use a metal wire 10 used in a low voltage applying region. However, a metal wiring for a lower voltage use formed in the dummy region may not necessarily be connected to the semiconductor component d.

The high voltage applying region B includes a digital isolator region 300 and 400, and one or more inter-metal dielectric layers having a certain thickness of t or more that is required to perform a role of insulation tolerating a high voltage. For example, when a high voltage of 20,000V or more is applied to the region, the required thickness of an interlayer insulation layer is at least 17 µm. However, a thickness of an interlayer insulation layer that may be deposited at one time in a depositing equipment may be limited. For example, the depositing equipment may be able to deposit only 5 µm at a time. Therefore, when the thickness for insulation that is required for insulation is above the thickness that can be deposited at one time, a plurality of inter-metal dielectric layers are deposited over a number of depositing processes.

Due to the characteristics of the semiconductor process, depositing an inter-metal dielectric layer is conducted not only in the high voltage applying region B but also in the low voltage applying region A. Herein, the low voltage range may be 2-10 V. Therefore, the low voltage applying region A may also have a plurality of inter-metal dielectric layers deposited between a first lower metal layer 100a and first upper metal layer 200a. The high voltage applying region B which includes a digital isolator region 300 and 400 may also have a plurality of inter-metal dielectric layers 300 deposited between a second lower metal layer 100b and a second upper metal layer 200b. The second lower metal layer 100b and the second upper metal layer 200b of the digital isolator region correspond to the first lower metal layer 100a and the first lower metal layer 200a of the low voltage applying region A, respectively. As illustrated in FIG. 1, in the digital isolator region, a plurality of inter-metal dielectric layers 300 and etching stop layers 400 are formed, without a contact plug which connects the second lower metal layer 100b and the second upper metal layer 200b. The overall thickness of the plurality of inter-metal dielectric layers 300 and etching stop layers 400 combined together may be very thick. For instance, the overall thickness may be as high as 15-40 µm. Considering that a total thickness of a general inter-metal dielectric layer is around 4-5 µm in a case where only a low voltage device is formed without such a digital isolator, it can be said that the total thickness of the inter-metal dielectric layers used in the digital isolator region is very big.

For example, the thickness of an oxide film used in the digital isolator may be 17 µm, whereas the thickness of the inter-metal dielectric layer formed between the upper metal layer and the lower metal layer in a low voltage device may be approximately 1 µm. In addition, a metal wiring formed in the low voltage device requires at least four (4) metal wiring layers. In order to form the four metal wiring layers, three inter-metal dielectric layers are formed. Thus, the total thickness of the four metal wiring layers and three inter-metal dielectric layers becomes about 4-5 µm. As a result, there exists about 12-13 µm of difference in thickness when the metal wiring is formed in a low voltage region, as compared to the digital isolator formed in a high voltage region. In addition, a pad is generally added to apply an electrical signal on a last metal layer of such a low voltage region. To place the pad, an etching is performed through the thickness of the insulation layer formed on the last metal layer. The process of etching 12-13 µm of additional thickness at once increases the processing costs and the processing time. This results in a reduction in the efficiency of the process.

In addition, when a metal pattern is formed on an even insulation layer having a flat surface, and an inter-metal dielectric layer is formed, a curvature occurs in the inter-metal dielectric layer due to the curvature of the metal pattern. In order to remove this curvature, a Chemical Mechanical Polishing (CMP) process is conducted on the deposited inter-metal dielectric layer. However, the curvature of the inter-metal dielectric layer is not removed entirely by the CMP process. As a result, due to the metal pattern density variation, a region where the metal pattern density is high is etched less than where the metal pattern density is low. Thus, there may be differences of the height in a region where there is no metal pattern and the height in the region where there is a metal pattern. Such variations in heights are referred to as a level difference. The level difference intensifies as the inter-metal dielectric layer and metal layer increase in thickness or numbers. However, when applied to a digital isolator in such a state, an even greater level difference occurs, which needs to be resolved.

As such, the metal wiring 10 of an example semiconductor device may have a large total thickness of, for example, approximately 15 to 40 µm for the inter-metal dielectric layers formed in a high voltage applying region. In addition, a plurality of trench-type VIA layers may be deposited in a low voltage applying region of the same semiconductor device.

The first lower metal layer 100a is electrically connected to the semiconductor component d. The first lower metal layer 100a is formed on an insulation layer i. The first lower metal layer 100a is made of a metal material in order to enable an electrical wiring. For example, a metal material having excellent electrical conductivity, such as aluminum or copper, may be used. There are many other materials having excellent electrical conductivity that may be used instead of aluminum and copper.

In this example, the first upper metal layer 200a is electrically connected to an external power supply (not illustrated). The first upper metal layer 200a is formed on the upper portion of the inter-metal dielectric layer 300e, which is the upper most dielectric layer among the plurality of inter-metal dielectric layers 300 formed in the low voltage applying region A. The first upper metal layer 200a is made of a metal material. The first lower metal layer 100a is also made of a metal material. For example, the first upper metal layer 200a and the first lower metal layer 100a may be both made of aluminum. In other examples, other materials having excellent electrical conductivity may be used for the first upper metal layer 200a.

In the example illustrated in FIG. 1, a plurality of inter-metal dielectric layers 300 are deposited between the first lower metal layer 100a and the first upper metal layer 200a, according to the thickness t required between the first lower metal layer 100a and first upper metal layer 200a. The plurality of inter-metal dielectric layers 300 are deposited on top of each other between the first lower metal layer 100a and first upper metal layer 200a.

For instance, in the example illustrated in FIG. 1, the plurality of inter-metal dielectric layers 300 include a first inter-metal dielectric layer 300a, a second inter-metal dielectric layer 300b, a third inter-metal dielectric layer 300c, a fourth inter-metal dielectric layer 300d, and a fifth inter-metal dielectric layer 300e, formed in that order above the first lower metal layer 100b. Each inter-metal dielectric layer 300 may consists of an oxide film. In addition, the oxide film may consist of a compressive stress layer that has excellent compressive stress characteristics, and a tensile stress layer that has excellent tensile stress characteristics. Because the overall thickness of the plurality of inter-metal dielectric layers is large and because depositing the layers applies stress in only one direction, problems such as bowing or curving of the semiconductor device may occur. Therefore, a tensile stress layer, a compressive stress layer or both may be deposited in turns in each of the inter-metal dielectric layers when the inter-metal dielectric layers are being formed. In isolation, the compressive stress layer tends to bend downward, while the tensile stress layer tends to bend upward under stress. Thus, the compressive stress layer has a tendency to form a negative curvature while the tensile stress layer has a tendency to form a positive curvature. Accordingly, depositing tensile stress layers and compressive stress layers in turns has the effect of reducing or preventing bending of the inter-metal dielectric layers.

For instance, in an example in which four separate deposits are made to form the second inter-metal dielectric layer, it is possible to form the second inter-metal dielectric layer by forming tensile stress layer/compressive stress layer/tensile stress layer/compressive stress layer. Otherwise, the second inter-metal dielectric layer may be formed by depositing compressive stress layer/tensile stress layer/tensile stress layer/compressive stress layer. Otherwise, in a case where the entire first inter-metal dielectric layer is deposited by tensile stress layer, the entire second inter-metal dielectric layer may be compressed stress layer, and the entire third inter-metal dielectric layer may be tensile stress layer. The characteristics of the inter-metal dielectric layer 300 due to the above are explained in detail with reference to FIGS. 2 to 8.

Each of the inter-metal dielectric layers 300 include at least one contact plug 350 for electrically connecting the first lower metal layer 100a and the first upper metal layer 200a. However, there is no contact plug in the high voltage region B, which is the digital isolation region. There is only a thick inter-metal dielectric layer to tolerate the high voltage between the second lower metal layer 100b and second upper metal layer 200b. For instance, the second upper metal layer 200b is a floating upper metal layer since it is not connected to the second lower metal layer 100a. A capacitor structure is obtained due to the inter-metal dielectric layers 300. If it is connected to a contact plug, the upper metal layer and lower metal layer are connected and thus cannot maintain the high voltage.

The contact plugs 350 are made of a conductor or a metal material having an excellent electrical conductivity so that the first lower metal layer 100a and the first upper metal layer 200a can be electrically connected. For the conductor or the metal material, aluminum may be used in the first lower metal layer 100a and the first upper metal layer 200a. However, in this example, the metal material used in forming the contact plugs 350 is limited to tungsten or copper. Tungsten and copper are also conductors with an excellent electrical conductivity.

In the example illustrated in FIG. 1, the first inter-metal dielectric layer 300a is arranged on a lower most side of the plurality of inter-metal dielectric layers 300, and is formed on the insulation layer i. The first inter-metal dielectric layer 300a includes the first lower metal layer 100a. A lower end of the first contact plug of the first inter-metal dielectric layer 300a contacts the upper portion of the first lower metal layer 100a. On the upper portion of the first inter-metal dielectric layer 300a, the first etching stop layer 400a is formed. The first etching stop layer 400a is further discussed in detail with reference to FIGS. 2 to 8.

On the upper portion of the first etching stop layer 400a, a second inter-metal dielectric layer 300b, a third inter-metal dielectric layer 300a, a fourth inter-metal dielectric layer 300d, and a fifth inter-metal dielectric layer 300e are respectively formed. To stop the etching when forming a VIA hole or trench, a second etching stop layer 400b, a third etching stop layer 400c, and a fourth etching stop layer 400d are provided between each of the inter-metal dielectric layers 300a, 300b, 300c, 300d and 300e.

In addition, each of the inter-metal dielectric layers 300b, 300c, 300d and 300e includes a second contact plug 350b, a third contact plug 350c, a fourth contact plug 350d, and a fifth contact plug 350e formed on the first contact plug 350a to connect the first lower metal layer 100a and the first upper metal layer 200a. Therefore, the contact plugs 350 consists of 5 separate contact plugs including a first, second, third, fourth, and fifth contact plugs.

On an upper portion of the fifth inter-metal dielectric layer 300e, the first upper metal layer 200a is formed. An upper end of the fifth contact plug 350e contacts the lower portion of the first upper metal layer 200a.

As a result, in the metal wiring according to an example of the present disclosure, the contact plugs 350 formed on each inter-metal dielectric layers 300 may contact each other above and below, between the first lower metal layer 100a and the first upper metal layer 200a.

In an example in which a plurality of inter-metal dielectric layers 300 are deposited, the metal wiring 10 may obtain an electrical connection of the first lower metal layer 100a and the first upper metal layer 200a with only the contact plugs 350, without the use of additional metal layers.

FIGS. 2 to 8 are cross-sectional views illustrating an example of a manufacturing method to obtain the metal wiring of region A illustrated in the semiconductor device of FIG. 1.

Figure 2:
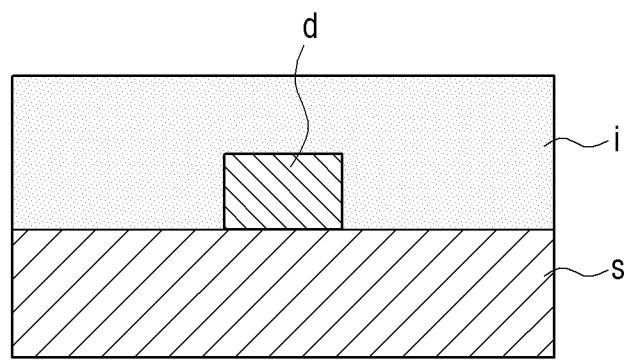
FIGS. 2 to 8 are cross-sectional views illustrating an example of a manufacturing method of a metal wiring of region A of a semiconductor device according to another example.

With reference to FIG. 2, first of all, a semiconductor component d may be formed on a substrate s. Next, an insulation layer i may be deposited so as to cover the semiconductor component d for insulation among devices. This process may be preceded by a general semiconductor substrate process, such as Front End of Line (FEOL) method.

Figure 3:
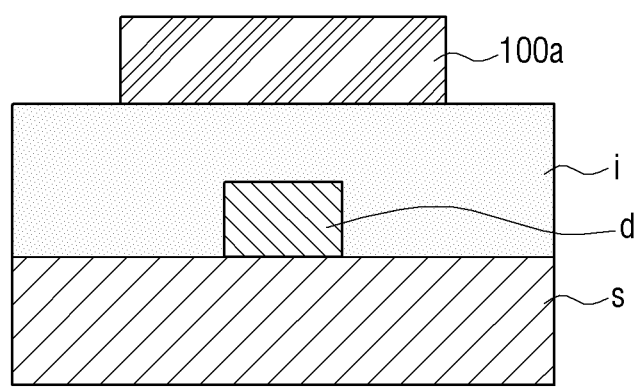

With reference to FIG. 3, a first lower metal layer 100a may be formed on the insulation layer i. The first lower metal layer 100a may be formed using a metal mask.

Figure 4:
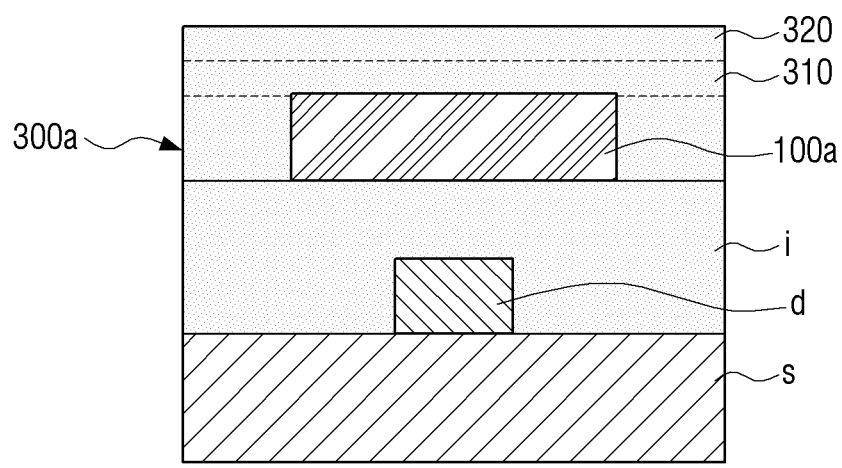

With reference to FIG. 4, a first inter-metal dielectric layer 300a may be deposited to cover the left side and the right side, as well as the upper portion of the first lower metal layer 100a. The first inter-metal dielectric layer 300a consists of an oxide film as mentioned above, and a tensile stress layer 310 and compressive stress layer 320 may be deposited in turns to form the first inter-metal dielectric layer 300a. Either PE-TEOS or USG may be used as the oxide film. However, in the present example, PE-TEOS is preferably used. The PE-TEOS film may be deposited using a Plasma Enhanced CVD (PECVD) method.

In a case where the tensile stress layer 310 is exposed to air, it changes into a compressive stress layer 320. Thus, on an upper most portion of the first insulation layer 300a that is exposed to air during a process of depositing the inter-metal dielectric layer 300a, the compressive stress layer 320 is deposited. It is desirable that the tensile stress layer 310 and compressive stress layer 320 are deposited in a certain fixed thickness. Each of the tensile stress layer 310 and compressive stress layer 320 in the present example are deposited to have 1 μm thickness. On a surface of a wafer where the tensile stress layer 310 and compressive stress layer 320 are deposited in turns, there is no bending or curving. In this example, when only the tensile stress layer is deposited, a PE-TEOS layer having a dented shape is formed. When only the compressive stress is deposited, a PE-TEOS film layer having a convex shape is formed, thereby worsening bending or curving of the wafer. Such bending or curving of wafer eventually makes a photo lithography process, which is the next process, difficult to perform. It is easier to form a pattern on an even surface. Forming a pattern on a curved surface involves various issues such as the determination of a Depth Of Focus (DOF), etc. Therefore, it is desirable to deposit after stirring. In addition, there may be an effect of offsetting the compressive stress and tensile stress, thereby stabilizing the overall changes of stress of the inter-metal dielectric layer. In addition, by doing as aforementioned, the bending of the wafer may be kept to 100 μm or less.

When depositing the PE-TEOS film, it is possible to change the RF power conditions and form a tensile stress layer and compressive stress layer. For example, when everything is turned on under an RF power 1 condition and RF power 2 condition, a compressive stress layer is formed. When the RF power 1 is on, and the RF power 2 is off, a tensile stress layer is formed.

After depositing of the first inter-metal dielectric layer 300a, the first inter-metal dielectric layer 300a is polished evenly through a Chemical Mechanical Polishing (CMP) process. This process is used for obtaining a flat surface by polishing thin layers that are formed unnecessarily.

Figure 5:
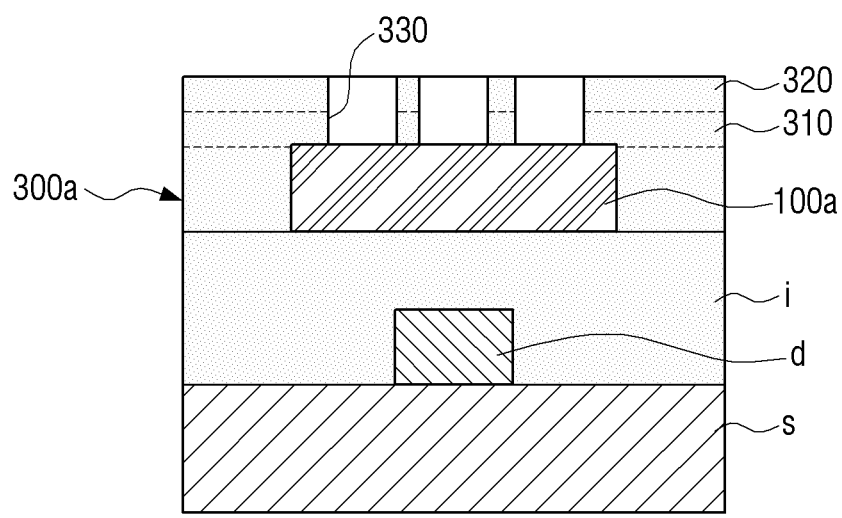

With reference to FIG. 5, after the CMP process, at least one VIA hole or trench 330 is patterned so that a portion of the upper portion of the first lower metal layer 100a can be exposed. The VIA hole or trench 330 may be patterned as a hole or trench. In the example illustrated in FIG. 5, the VIA hole or trench 330 is patterned as a trench.

Figure 6:
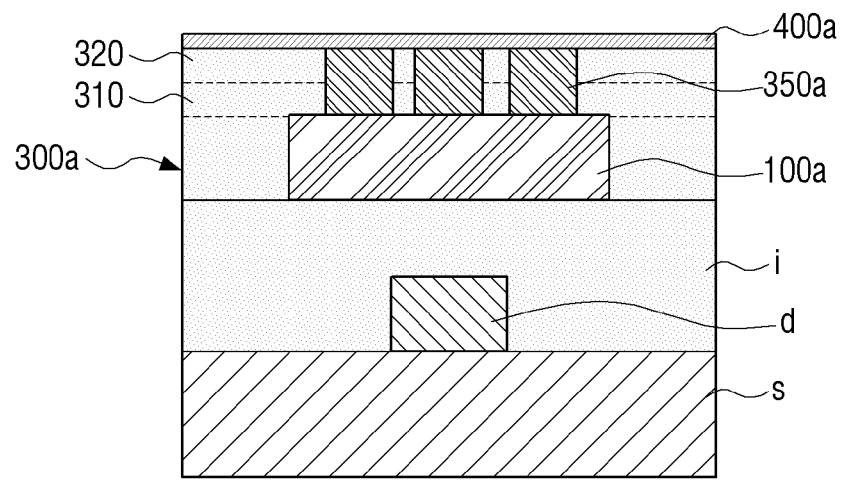

With reference to FIG. 6, after the patterning of the VIA trench 330, a metal material is placed by a gap-fill process in the trench to form a contact plug 350a. As aforementioned, in this example, tungsten is used as the metal material. Considering the resistance and retention rate of the VIA trench, it is desirable that at least 3 VIA trenches are used.

After the gap-fill process, a CMP process is conducted, and then the first etching stop layer 400a is deposited. The first etching stop layer 400a prevents excessive etching (ex. dry etching) during the patterning of the VIA trenches that are formed thereafter. The first etching stop layer 400a consists of a different material from an inter-metal dielectric layer, which is an oxide layer, and thus may prevent etching of the inter-metal dielectric layer below the first stop layer 400a. Examples of suitable materials that may be used for the first etching stop layer 400a include silicon nitride (SiN), silicon oxynitride (SiON), and silicon carbide, and the like. Other etching stop layers 400b, 400c, 400d may be also made from these materials. It is desirable that the thickness of the etching stop layers 400 ranges from 100 Å to 2000 Å.

Figure 7:
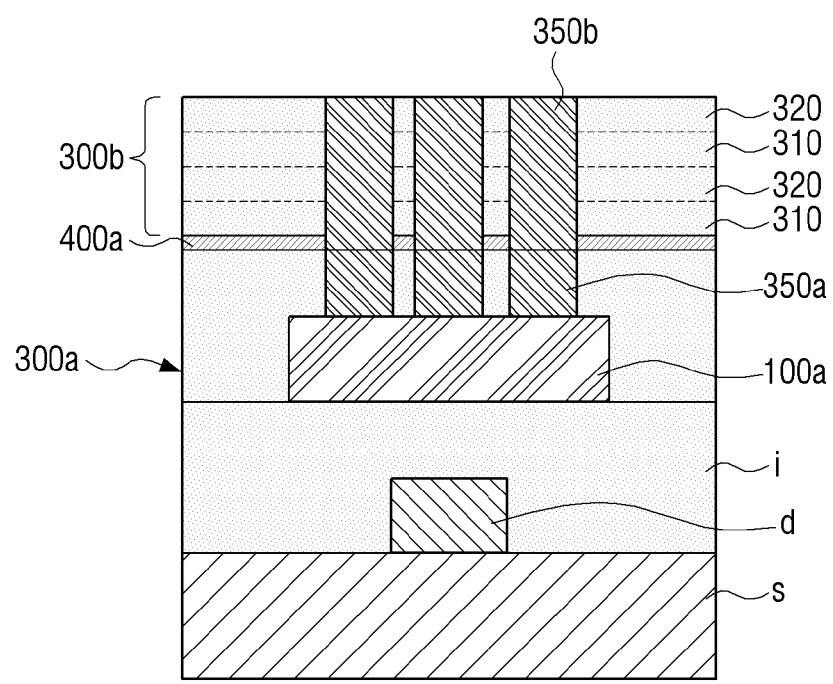

With reference to FIG. 7, the second inter-metal dielectric layer 300b is deposited on the first etching stop layer 400a. The second inter-metal dielectric layer 300b is formed through depositing the tensile stress layer 310 and the compressive stress layer 320 in turns. It is desirable that the tensile stress layer 310 and compressive stress layer 320 are deposited twice in turns. Further, the compressive stress layer may be arranged on the upper most portion of the inter-metal dielectric layer 300b. In a case where the thickness of each of the tensile stress layer and the compressive stress layer is 1 μm, four separate depositing processes are performed. As a result, the total thickness of the second inter-metal dielectric layer 300b becomes at least 4 μm. In this example, the tensile stress layer 310 and the compressive stress layer 320 are deposited while changing the depositing conditions, and thus PE-TEOS film is used. For example, it is desirable to deposit a thickness of 1 μm at a time, but the depositing a thickness of 1-5 μm at a time is also possible when necessary.

When the CMP process is completed after depositing the second inter-metal dielectric layer 300b, a VIA patterning is performed. The VIA pattern may be made with VIA trenches as in the previous VIA trenches. The etching process of the second inter-metal dielectric layer 300b is proceeded until the first etching stop layer 400a is exposed, and when the first etching stop layer 400a is exposed, the etching of the second inter-metal dielectric layer 300b ends. The thickness of the trench is similar to the thickness of the second inter-metal dielectric layer 300b and the first etching stop layer 400a combined; thus, the thickness becomes 4 μm or more. That is due to the fact that a trench is formed after etching the first etching stop layer 400a.

After the trench patterning, a metal material is filled in the trench through a gap-fill process, in order to form a second contact plug 350b in the second inter-metal dielectric layer 300b. Through this process, the lower portion of the second contact plug 350b of the second inter-metal dielectric layer 300b contacts the upper portion of the first contact plug 300a. When the gap-fill process is completed, the CMP processing is performed again. The thickness of the second contact plug 350b is almost the same as the thickness of the trench. For example, when the total thickness of the second inter-metal dielectric layer 300b and first etching stop layer 400a is 4.1 μm, the thickness of the trench and the second contact plug 350b is also around 4.1 μm. This is approximately 4 times the thickness of a contact plug used in a conventional low voltage device.

Figure 8:
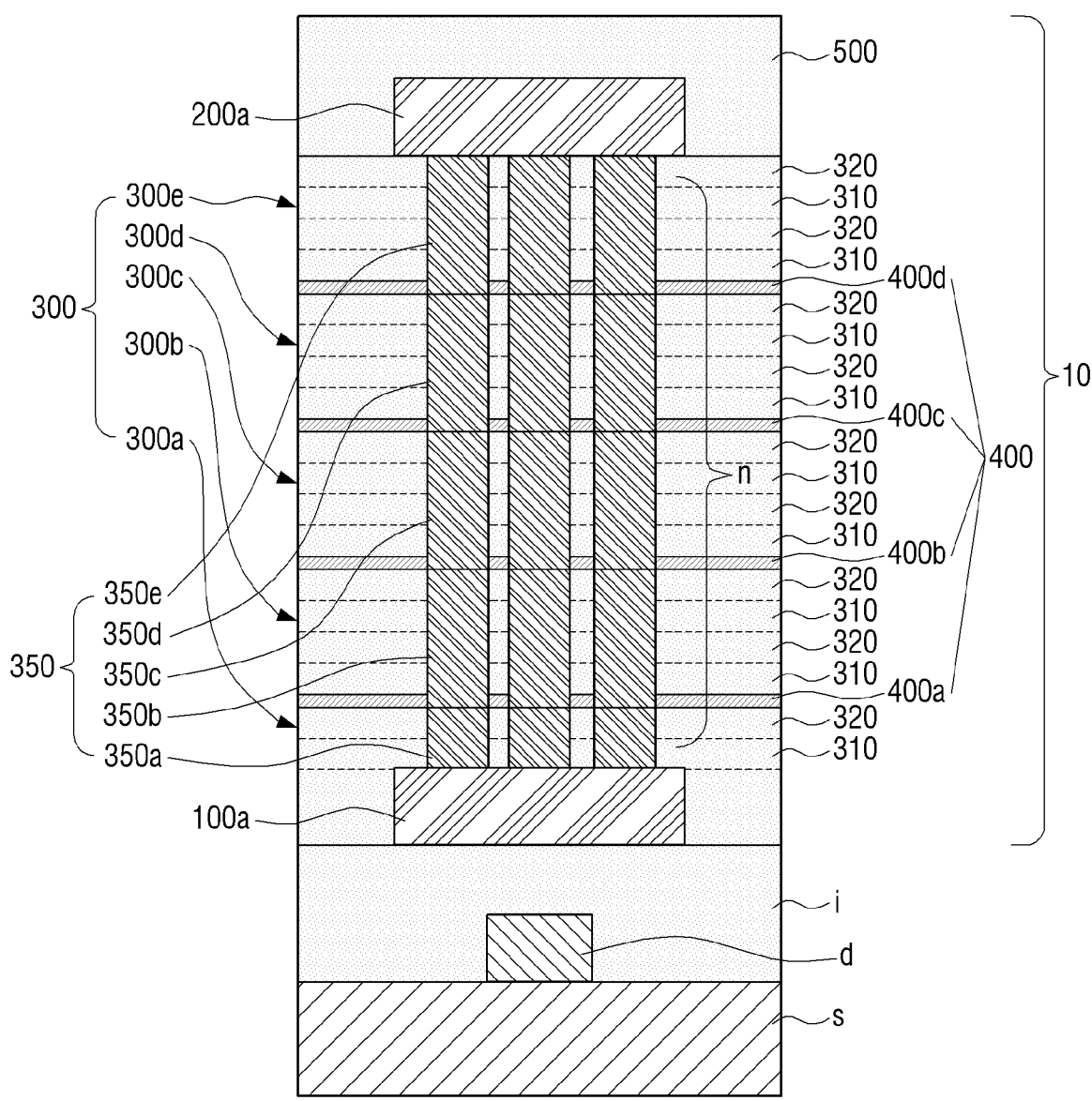

With reference to FIG. 8, inter-metal dielectric layers 300c, 300d, and 300d having a contact plug 350 are formed by the process illustrated in FIG. 7. In this example, five (5) inter-metal dielectric layers 300a to 300e are provided. The number n of the inter-metal dielectric layers 300 may vary depending on the required thickness. The process of each inter-metal dielectric layer 300 may be performed in process described above. As illustrated in FIG. 8, the width of a contact plug is the same regardless of the location of the inter-metal dielectric layer. This is possible because it is continuously etched by the trench of the same size. In addition, since the upper metal layer and lower metal layer are connected by only a contact plug, it consists of the same material. That is, it is made of tungsten in this example. Since the contact plugs are made of the same material, the process becomes simple, and the resistance may be adjusted to be consistent. On the other hand, the upper and lower metal layers are made of aluminum. In a case of forming the upper and lower metal layers in a dual damascene method, the contact plugs and the upper and lower metal layers can all be made of the same material, such as copper.

In metal wiring of a conventional semiconductor device in FIG. 8, the first, third, and fifth contact plugs are contact plugs, while the second and forth contact plugs are actually metal wirings. That is, supposing the first lower metal layer 100*a* is a first metal wiring, the second contact plug becomes a second metal wiring, and the fourth contact plug becomes the third metal wiring. In addition, the first upper metal layer 200*a* becomes the fourth metal wiring. In a metal wiring of a conventional semiconductor device, aluminum was generally used as the metal wiring material. In the example described in herein, tungsten or copper material is used. Therefore, as aforementioned, a conventional semiconductor device had a metal wiring and a contact plug made of aluminum and tungsten, respectively, to form the entire metal wiring layer, whereas in the example described herein, the contact plug and metal wiring are made of only one material, such as tungsten or copper metal. Therefore, the manufacturing process may be simpler, and the resistance may be adjusted to be consistent. Especially, when the metal wiring is made of metallic copper, the resistance is much lower than the metallic aluminum, and thus the resistance of the entire metal wiring becomes lower.

In addition, as aforementioned, when a metal pattern is formed on an even insulation layer, and an inter-metal dielectric layer is formed, a curvature also occurs in the inter-metal dielectric layer by the curving of the metal pattern. A CMP process is conducted on the deposited inter-metal dielectric layer in order to remove the curved surface. But, even the CMP process cannot remove all the curvature in the inter-metal dielectric layers. Due to the metal pattern density, etching is not performed in the same degree in regions where the metal pattern density is high as in regions where the metal pattern density is low. Therefore, a difference of the total height occurs in the regions where there is no metal pattern as compared to the regions where there is a metal pattern. That is, a level difference exists in the resulting device, which intensifies as the inter-metal dielectric layer and metal layer increases in number or thickness.

However, the examples of the present disclosure do not involve forming a metal pattern on a flattened inter-metal dielectric layer, as it was done in the past. Rather, it repeatedly forms a trench-type contact plug on top of each other. In a conventional device, forming a metal pattern involved: depositing a metal material on a flattened inter-metal dielectric layer, coating the metal material with a resist material, and then performing an etching process through exposing to light and developing a pattern, in order to obtain the metal pattern. However, in this example, forming a metal pattern means depositing etching stop layer and inter-metal dielectric layer on a flattened inter-metal dielectric layer, forming a trench on the inter-metal dielectric layer, and filling a metal layer and flattening the metal layer. That is, it is a process quite similar to the single damascene process, only conducted repeatedly.

The inter-metal dielectric layer deposited between the upper metal layer and lower metal layer is deposited 16 times, and thus approximately a thickness of 16 μm is formed. Since an etching stop layer exists between the inter-metal dielectric layer, the thickness exceeds 16 μm. Since it has to tolerate at least 20,000V in the high voltage region where the digital isolator region is provided, the total thickness of the inter-metal dielectric layer formed in the low voltage region must be between 15-40 μm.

On the fifth inter-metal dielectric layer 300*e* provided on the upper most side of the inter-metal dielectric layers 300, the etching stop layer 400 is not deposited, and the first upper metal layer 200*a* is formed. The first upper metal layer 200*a* is formed using a metal mask as in the first lower metal layer 100*a*.

After the first upper metal layer 200*a* is formed, an oxide film 500 that covers the first upper metal layer 200*a* is deposited. The oxide film 500 is deposited for the follow-up process, and the first upper metal layer 200*a* is electrically connected with an external power supply in the follow-up process.

In this example, when a plurality of inter-metal dielectric layers 300 are formed for an electric wiring, it is possible to embody the electric wiring of a semiconductor component through a connection between the contact plugs 350 without using additional metal layers or columns between the first lower metal layer 100*a* and first upper metal layer 200*a*. Therefore, the metal wiring of the semiconductor device according to the present example does not require a process for forming additional metal layers, and thereby reduces the processing cost and increases the efficiency of the manufacturing process.

Figure 9:
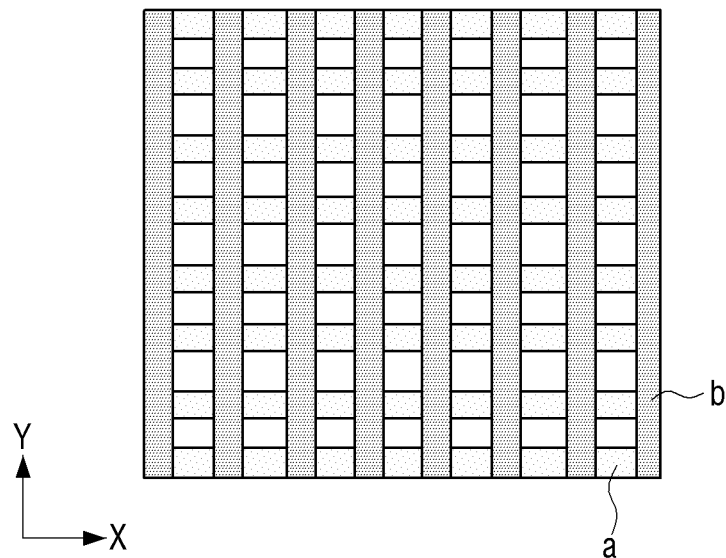
FIGS. 9 to 11 are views illustrating formats of VIA trench arrangements according to various examples of semiconductor devices.
Figure 10:
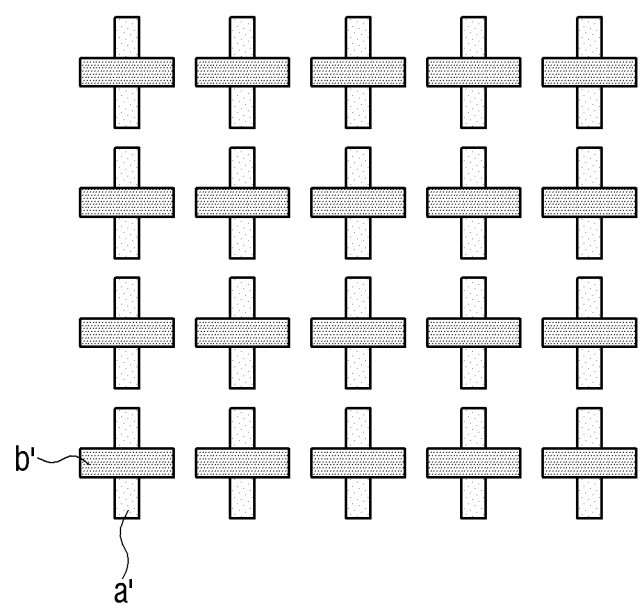
Figure 11:
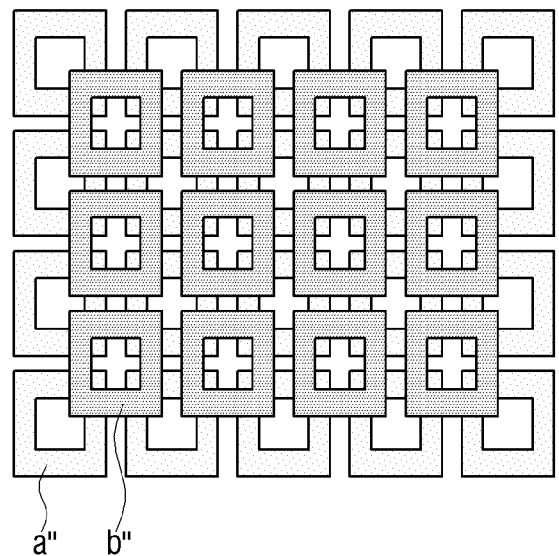

FIGS. 9 to 11 illustrate arrangements of VIA trenches according to various examples.

In the example illustrated in FIG. 9, VIA trenches a and b that are arranged above and below contact each other in a crisscross manner. FIG. 9 is an example of VIA trenches formed on two adjacent inter-metal dielectric layers. The VIA trenches a lined up in an X direction on the lower portion are VIA trenches formed on the inter-metal dielectric layer arranged on the lower portion of the two adjacent inter-metal dielectric layers. The VIA trenches lined up in a Y direction of the upper portion are VIA trenches formed on the upper portion in the two adjacent inter-metal dielectric layers.

As described above with respect to previous examples, VIA trenches a and b illustrated in FIG. 9 are trench-types VIAs. More specifically, VIA trenches a formed on the lower portion and VIA trenches b formed on the upper portion b contact each other to cross the other at right angles. As they cross at right angles, the problems of cross talk prevention and pat tracking between the lower and upper contact plugs can be resolved. Crossing at right angles generates less torque than when contacting in parallel, as well as reduce pat tracking.

In this example, during the process of contacting of the contact plugs in adjacent inter-metal dielectric layers, a simple process of patterning the VIA holes/trenches to cross one another can make contacting of the adjacent contact plugs easier.

With reference to FIG. 10, during a trench-type VIA patterning, VIA trenches a' in the lower portion may be patterned with a certain distance from one another. The VIA trenches b' on the upper portion may also be patterned with a certain distance from one another. The patterning of VIA trenches may vary in numerous ways as long as it enables contacting of upper and lower VIA trenches a' and b'. Distancing the VIA trenches from one another by spacing them apart reduces the metal remnant problem. For example, in FIG. 9, the metal line is very long, and thus a large amount of metal must be etched during metal etching. In this case, if a portion is not etched, metal remnants occur. Herein, a bridge is formed between adjacent metals on the same surface, thereby causing a short problem. When the VIA trenches are formed as illustrated in FIG. 10, the possibility of a bridge phenomenon is significantly reduced.

With reference to FIG. 11, VIA trenches a" and b" may also be patterned in square shapes. The upper VIA trenches b"

contact the lower VIA trenches a" on the four corners. Since the four corners contact one another, the current amount increases significantly, thereby improving speed of the device. Furthermore, it may also reduce pat tracking. The patterning may obviously be made in shapes other than the square shapes as well.

Figure 12:
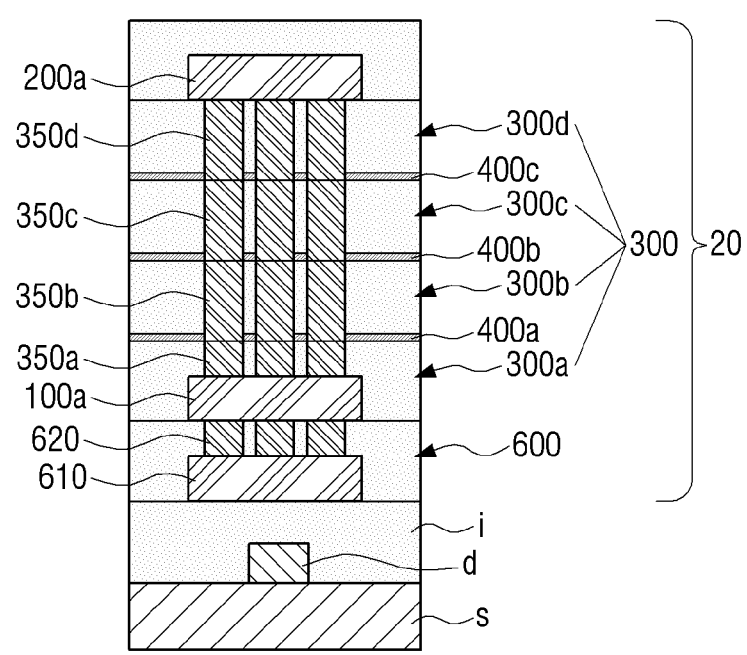
FIGS. 12 to 14 are cross-sectional views illustrating formats of metal wirings formed in various examples of semiconductor devices.
Figure 13:
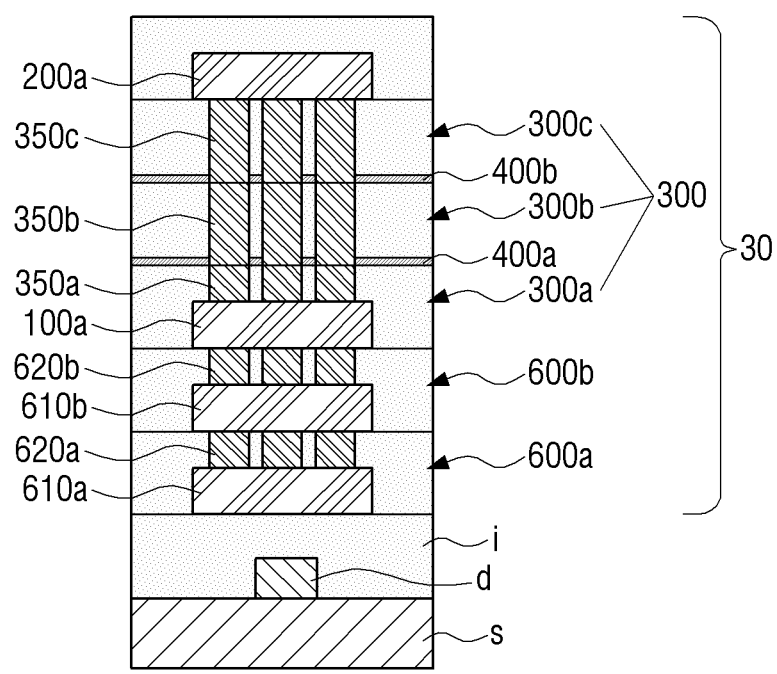
Figure 14:
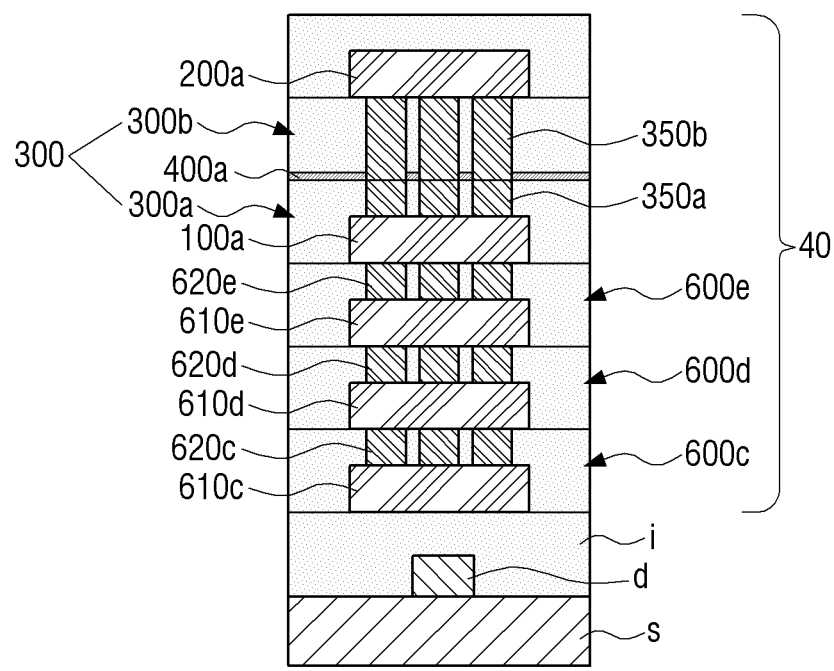

FIGS. 12 to 14 are cross-sectional views illustrating the metal wiring shapes of various examples of semiconductor devices.

With reference to FIG. 12, the metal wiring of the semiconductor device includes a first lower metal layer 100a, a first upper metal layer 200a, an inter-metal dielectric layer 300, and a metal layer 600. The metal wiring 20 in this example comprises four inter-metal dielectric layers 300a, 300b, 300c, and 300d. As in the examples described above, the inter-metal dielectric layer 300a in the lower most side includes the first lower metal layer 100a, and the inter-metal dielectric layer 300d of the upper most side contacts the first upper metal layer 200a through the contact plug 350.

In the example illustrated in FIG. 12, a metal-containing layer 600 is an element added for a design consideration or other reasons. The semiconductor may have a region in which the depositing of a plurality of metals is required. The metal-containing layer 600 includes a contact plug 620 that electrically connects a metal layer 610 with the first lower metal layer 100a. In this example, the contact plug 620 may be formed by a hole-type VIA patterning, unlike the contact plug 350 of the inter-metal dielectric layer 300.

FIG. 12 illustrates an example in which an additional metal-containing layer 600 is present. FIG. 13 illustrates a case where two additional metal-containing layers 600a and 600b are present. FIG. 14 illustrates a case where three additional metal-containing layers 600c, 600d, 600e are present. Each metal-containing layers 600a to 600e include a metal layer 610a to 610e and a contact plug 620a to 620e as the metal-containing layer 600. These examples are provided for illustrative purposes only. In other examples, additional metal layers may be further added for a semiconductor design consideration or other reasons.

The inter-metal dielectric layer in these examples is a region where metal layers are not necessarily required but where an electrical wiring is required. FIG. 13 illustrates an example in which three inter-metal dielectric layers 300a, 300b, 300c are provided. FIG. 14 illustrates an example in which two inter-metal dielectric layers 300a and 300b are provided. The number of inter-metal dielectric layers 300 may change in various ways according to the thickness between the upper metal layer and upper metal layer that is required by semiconductor design considerations.

With respect to the examples described above, it is respectfully noted that the drawings may not be necessarily drawn to scale, and, in some instances, proportions may have been exaggerated in order to clearly illustrate features of the examples. In addition, when a first layer is referred to as being "on" or above a second layer or "on" a substrate, it may not only refer to a case where the first layer is formed directly on the second layer or the substrate but may also refer to a case where a third layer exists between the first layer and the second layer or the substrate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A metal wiring for applying a voltage to a semiconductor component of a semiconductor device, the semiconductor device comprising a low voltage applying region adjacent to a high voltage applying region, the metal wiring comprising:
   an isolator region;
   a first lower metal layer electrically connected to the semiconductor component;
   a first upper metal layer configured to be electrically connected to an external power supply;
   a plurality of inter-metal dielectric layers deposited between the first lower metal layer and the first upper metal layer, each of the plurality of inter-metal dielectric layers comprising at least one contact plug formed in a via trench for providing an electrical connection between the first lower metal layer and the first upper metal layer; and
   a plurality of etching stop layers deposited on each of the plurality of inter-metal dielectric layers,
   wherein the plurality of inter-metal dielectric layers are each a continuous multilayer oxide film formed between adjacent etching stop layers or between the first upper or lower metal layer and its respective adjacent etching stop layer,
   wherein the plurality of inter-metal dielectric layers are each a multilayer oxide film comprising a plurality of alternating tensile stress oxide layers and compressive stress oxide layers.

2. The metal wiring according to claim 1, wherein a via trench of a lower most inter-metal dielectric layer of one side in two adjacent inter-metal dielectric layers contacts a via trench of an inter-metal dielectric layer of another side, and wherein the via trenches are square-shaped.

3. The metal wiring according to claim 2, wherein, in two adjacent inter-metal dielectric layers, a contact plug of an interlayer insulation layer of one side has a same width as a contact plug of an interlayer insulation layer of another side.

4. The metal wiring according to claim 1, wherein a via trench of an inter-metal dielectric layer of one side in two adjacent inter-metal dielectric layers contacts a via trench of an inter-metal dielectric layer of another side in a crisscross manner.

5. The metal wiring according to claim 3, wherein the via trenches are spaced apart from each other by a predetermined linear distance and a predetermined parallel distance.

6. The metal wiring according to claim 1, further comprising an etching stop layer formed between two adjacent interlayer insulation layers,
   wherein the contact plug penetrates the etching stop layer.

7. The metal wiring according to claim 1, wherein a compressive stress layer is arranged on an upper most portion of the at least one inter-metal dielectric layer.

8. The metal wiring according to claim 1, wherein the contact plug is made of tungsten or copper.

9. The metal wiring according to claim 1, wherein the contact plugs are configured to function as a metal wiring and as a contact plug, each of the contact plugs that function as the metal wiring consisting of a same material.

10. The metal wiring according to claim 1, wherein the isolator region is in a high-voltage applying region.

11. The metal wiring according to claim 1, further comprising a second upper metal layer and a second lower metal layer formed on an upper portion and a lower portion of the isolator region.

12. The metal wiring according to claim 11, wherein the second upper metal layer and the second lower metal layer are formed with the same material and thickness as the first upper metal layer and first lower metal layer, respectively.

13. The metal wiring according to claim 11, wherein the plurality of inter-metal dielectric layers and one or more etching stop layers are formed between the second upper metal layer and the second lower metal layer.

14. The metal wiring according to claim 13, wherein, in the isolator region, a total combined thickness of the plurality of inter-metal dielectric layers and the one or more etching stop layers is 15-40 μm.

15. The metal wiring according to claim 11, wherein the inter-metal dielectric layers of the isolator region are formed in a same process as the inter-metal dielectric layer.

16. The metal wiring according to claim 1, wherein a thickness of each inter-metal dielectric layer is 1-5 μm.

17. The metal wiring according to claim 1, wherein at least one of the plurality of inter-metal dielectric layers is selected from the group consisting of plasma-enhanced tetraethyl-orthosilicate (PE-TEOS) and undoped silicate glass (USG).

18. The metal wiring according to claim 1, wherein the plurality of inter-metal dielectric layers are each a multilayer oxide film consisting of a plurality of tensile stress oxide layers and compressive stress oxide layers.

19. A metal wiring of a semiconductor device, the metal wiring comprising:
an isolator device;
a first lower metal layer and a first upper metal layer, a plurality of inter-metal dielectric layers that are each a continuous multilayer oxide film deposited between the first lower metal layer and the first upper metal layer, a plurality of etching stop layers between each continuous multilayer oxide film, and a contact plug formed in the plurality of inter-metal dielectric layers,
wherein the first lower metal layer is not electrically connected to the semiconductor device,
wherein the plurality of inter-metal dielectric layers are each a multilayer oxide film comprising a plurality of alternating tensile stress oxide layers and compressive stress oxide layers.

20. The metal wiring according to claim 19, wherein the isolator device comprises an isolator region.

21. The metal wiring according to claim 20, wherein a second upper metal layer and a second lower metal layer are formed on an upper portion and a lower portion, respectively, of the isolator region.

22. The metal wiring according to claim 21, wherein the second upper metal layer and the second lower metal layer are formed with the same material and thickness as the first upper metal layer and first lower metal layer, respectively.

23. The metal wiring according to claim 21, wherein an inter-metal dielectric layer and an etching stop layer are formed between the second upper metal layer and the second lower metal layer.

24. The metal wiring according to claim 23, wherein a total combined thickness of the inter-metal dielectric layers and etching stop layers in the isolator region is 15-40 μm.

25. The metal wiring according to claim 19, wherein a thickness of each inter-metal dielectric layer is 1-5 μm.

26. The metal wiring according to claim 19, wherein at least one of the plurality of inter-metal dielectric layers is selected from the group consisting of plasma-enhanced tetraethyl-orthosilicate (PE-TEOS) and undoped silicate glass (USG).

27. The metal wiring according to claim 19, wherein the plurality of inter-metal dielectric layers are each a multilayer oxide film consisting of a plurality of tensile stress oxide layers and compressive stress oxide layers.

* * * * *